(12) United States Patent
Sajiki

(10) Patent No.: US 10,505,071 B2
(45) Date of Patent: Dec. 10, 2019

(54) METHOD OF MANUFACTURING A LIGHT EMITTING DEVICE

(71) Applicant: NICHIA CORPORATION, Anan-shi (JP)

(72) Inventor: Shigeki Sajiki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/171,489

(22) Filed: Oct. 26, 2018

(65) Prior Publication Data

US 2019/0131489 A1  May 2, 2019

(30) Foreign Application Priority Data

Oct. 27, 2017  (JP) ................. 2017-208211

(51) Int. Cl.
| | |
|---|---|
| *H01L 33/00* | (2010.01) |
| *H01L 25/075* | (2006.01) |
| *H01L 33/50* | (2010.01) |
| *H01L 33/38* | (2010.01) |
| *H01L 33/32* | (2010.01) |

(52) U.S. Cl.
CPC ...... *H01L 33/0075* (2013.01); *H01L 25/0753* (2013.01); *H01L 33/32* (2013.01); *H01L 33/382* (2013.01); *H01L 33/502* (2013.01); *H01L 2933/0016* (2013.01); *H01L 2933/0033* (2013.01); *H01L 2933/0041* (2013.01)

(58) Field of Classification Search
CPC combination set(s) only.
See application file for complete search history.

(56) References Cited

U.S. PATENT DOCUMENTS

| | | | |
|---|---|---|---|
| 2008/0194061 A1* | 8/2008 | Medendorp | B29C 43/021 438/118 |
| 2009/0189177 A1* | 7/2009 | Lee | B29C 43/18 257/99 |
| 2011/0069256 A1 | 3/2011 | Ohkubo | |
| 2015/0085527 A1 | 3/2015 | Nam et al. | |

(Continued)

FOREIGN PATENT DOCUMENTS

| | | |
|---|---|---|
| JP | 2011-071221 | 4/2011 |
| JP | 2015-070273 | 4/2015 |

(Continued)

*Primary Examiner* — Ratisha Mehta
(74) *Attorney, Agent, or Firm* — Mori & Ward, LLP

(57) ABSTRACT

A method of manufacturing a light emitting device includes placing a light emitting element in a first recess; covering with a first cover member the second to fourth element lateral faces of the light emitting element exposed in the first recess; extracting from the first recess the light emitting element equipped with the first cover member; placing the light emitting element in the second recess by bringing the first element lateral face of the light emitting element extracted from the first recess into contact with the second recess first inner lateral face of the second recess and spacing the substrate face of the light emitting element apart from the second recess bottom face of the second recess; covering the substrate face with a second cover member in the second recess; and extracting from the second recess the light emitting element equipped with the second cover member formed thereon.

14 Claims, 8 Drawing Sheets

(56) References Cited

U.S. PATENT DOCUMENTS

| | | | |
|---|---|---|---|
| 2015/0137164 A1 | 5/2015 | Ichikawa |
| 2015/0340567 A1 | 11/2015 | Ichikawa |
| 2016/0020365 A1 | 1/2016 | Brandl et al. |
| 2016/0300987 A1 | 10/2016 | Sanga et al. |

FOREIGN PATENT DOCUMENTS

| | | |
|---|---|---|
| JP | 2015-097235 | 5/2015 |
| JP | 2015-207615 | 11/2015 |
| JP | 2015-225862 | 12/2015 |
| JP | 2016-510177 | 4/2016 |

\* cited by examiner

METHOD OF MANUFACTURING A LIGHT EMITTING DEVICE

CROSS-REFERENCE TO RELATED APPLICATION

This application claims priority under 35 U. S. C. § 119 to Japanese Patent Application No. 2017-208211, filed on Oct. 27, 2017, the disclosure of which is hereby incorporated by reference in its entirety.

BACKGROUND

1. Field of the Invention

The present disclosure relates to a method of manufacturing a light emitting device.

2. Description of the Related Art

Light emitting devices employing light emitting elements such as light emitting diodes are used as backlights in liquid crystal display devices, lighting fixtures, and the like. For such a light emitting device, a type that houses light emitting elements in a housing has been common. In view of recent needs of downsizing, however, a structure which includes a light reflecting member directly covering the lateral faces of a light emitting element instead of a housing has been proposed. See, for example, Japanese Unexamined Patent Application Publications Nos. 2015-70273 and 2011-71221.

The smaller the light emitting device, the more difficult it is to form a housing, or cover the lateral faces with a light reflecting member, making the manufacturing process more complex. Accordingly, there is a need for a more efficient method of manufacturing downsized light emitting devices.

Accordingly, the present disclosure advantageously provides a method of manufacturing a light emitting device capable of efficiently manufacturing downsized light emitting devices.

SUMMARY

A method of manufacturing a light emitting device is disclosed herein that includes: providing a light emitting element, a first mold, and a second mold, the light emitting element including an electrode formation face where electrodes are formed, a substrate face located on a side of the light emitting element opposite to the electrode formation face, and a first element lateral face, a second element lateral face, a third element lateral face, and a fourth element lateral face, the first, second, third, and fourth lateral faces being positioned between the electrode formation face and the substrate face, the first mold including a first recess having a first recess bottom face and a first recess first inner lateral face being in contact with the first recess bottom face, and the second mold including a second recess having a second recess bottom face and a second recess first inner lateral face being in contact with the second recess bottom face; placing the light emitting element by bringing the first element lateral face of the light emitting element into contact with a first recess first inner lateral face of the first recess of the first mold, and allowing the substrate face of the light emitting element to face the first recess bottom face of the first recess; covering, with a first cover member, the second element lateral face, the third element lateral face, and the fourth element lateral face of the light emitting element exposed in the first recess; extracting from the first recess the light emitting element equipped with the first cover member formed thereon; placing the light emitting element in the second recess by bringing the first element lateral face of the light emitting element extracted from the first recess into contact with the second recess first inner lateral face of the second recess of the second mold, and allowing the substrate face of the light emitting element to be spaced apart from the second recess bottom face of the second recess; covering, with a second cover member, the substrate face of the light emitting element in the second recess; and extracting from the second recess the light emitting element equipped with the second cover member formed thereon.

According to the embodiment described above, downsized light emitting devices can be efficiently manufactured.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4A1, FIG. 4B1, FIG. 4C1, and FIG. 4D1 are schematic end views showing steps of manufacturing a light emitting device according to a First Embodiment when the light emitting device is viewed from a right lateral face side;

FIG. 4A2, FIG. 4B2, FIG. 4C2, and FIG. 4D2 are schematic end views corresponding to FIG. 4A1, FIG. 4B1, FIG. 4C1, and FIG. 4D1 when the light emitting device is viewed from a front face side;

FIG. 5A1, FIG. 5B1, FIG. 5C1, and FIG. 5D1 are schematic end views showing the steps of manufacturing the light emitting device according to the First Embodiment when the light emitting device is viewed from the right lateral face side;

FIG. 5A2 and FIG. 5B2 are schematic end views corresponding to FIG. 5A1 and FIG. 5B1 when the light emitting device is viewed from the front face side;

FIG. 5C2 and FIG. 5D2 are schematic end views corresponding to FIG. 5C1 and FIG. 5D1 when the light emitting device is viewed from the lower face side;

FIG. 6A1, FIG. 6B1, FIG. 6C1, and FIG. 6D1 are schematic end views showing steps of manufacturing a light emitting device according to a Second Embodiment when the light emitting device is viewed from a right lateral face side;

FIG. 6A2, FIG. 6B2, FIG. 6C2, and FIG. 6D2 are schematic end views corresponding to FIG. 6A1, FIG. 6B1, FIG. 6C1, and FIG. 6D1 when the light emitting device is viewed from a front face side;

FIG. 7A1, FIG. 7B1, FIG. 7C1, and FIG. 7D1 are schematic end views showing the steps of manufacturing the light emitting device according to the Second Embodiment when the light emitting device is viewed from the right lateral face side;

FIG. 7A2 and FIG. 7B2 are schematic end views corresponding to FIG. 7A1 and FIG. 7B1 when the light emitting device is viewed from the front face side;

FIG. 7C2 and FIG. 7D2 are schematic end views corresponding to FIG. 7C1 and FIG. 7D1 when the light emitting device is viewed from the lower face side.

DESCRIPTION

Figure 1:
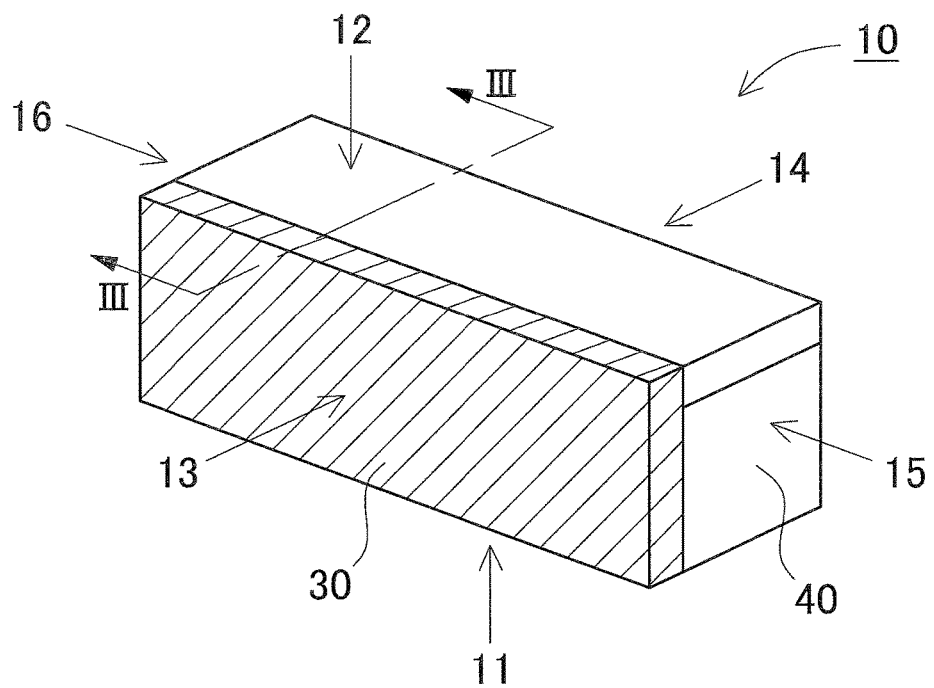
FIG. 1 is a schematic perspective view of a light emitting device according to an embodiment.

Certain embodiments and examples of the present invention will be explained below based on the drawings. However, the embodiments and examples are illustrations to give shape to the technical ideas of the present invention, and do not limit the present invention. The sizes of the members and positional relationships shown in the drawings might be exaggerated for clarity of explanations. In the explanations given below, moreover, the same designations and reference numerals denote the components that are identical or of similar component, for which the explanations will be omitted when appropriate. Furthermore, the constituent elements of the embodiments and examples of the present invention can be structured so that a single member constitutes multiple constituent elements to function as multiple elements, or the functionality of one member can be shared and achieved by multiple members. Some of the descriptions given in a certain example or embodiment can be applied to other examples or embodiments. In the explanations below, moreover, terms indicating certain directions and positions will be used as needed (for example, "upper," "lower," "right," "left," and other terms including these).

The method of manufacturing a light emitting device according to certain embodiments of the present disclosure can include: providing a light emitting element, a first mold, and a second mold, the light emitting element including an electrode formation face where electrodes are formed, a substrate face located on a side of the light emitting element opposite to the electrode formation face, and a first element lateral face, a second element lateral face, a third element lateral face, and a fourth element lateral face, the first, second, third, and fourth lateral faces being positioned between the electrode formation face and the substrate face, the first mold including a first recess having a first recess bottom face and a first recess first inner lateral face being in contact with the first recess bottom face, and the second mold including a second recess having a second recess bottom face and a second recess first inner lateral face being in contact with the second recess bottom face; placing the light emitting element by bringing the first element lateral face of the light emitting element into contact with a first recess first inner lateral face of the first recess of the first mold, and allowing the substrate face of the light emitting element to face the first recess bottom face of the first recess; covering, with a first cover member, the second element lateral face, the third element lateral face, and the fourth element lateral face of the light emitting element exposed in the first recess; extracting from the first recess the light emitting element equipped with the first cover member formed thereon; placing the light emitting element in the second recess by bringing the first element lateral face of the light emitting element extracted from the first recess into contact with the second recess first inner lateral face of the second recess of the second mold, and allowing the substrate face of the light emitting element to be spaced apart from the second recess bottom face of the second recess; covering, with a second cover member, the substrate face of the light emitting element in the second recess; and extracting from the second recess the light emitting element equipped with the second cover member formed thereon.

The method of manufacturing a light emitting device according to an other embodiment can further include covering with a light transmissive member the first element lateral face of the light emitting element with the second cover member formed thereon, subsequent to the extracting of the light emitting element from the second recess. This can form a light transmissive member on the first element lateral face which is the emission face of the light emitting element.

According to the method of manufacturing a light emitting device related to another embodiment, the first element lateral face of the light emitting element, the first cover member, and the second cover member can be continuously covered with a light transmissive member.

According to the method of manufacturing a light emitting device related to another embodiment, furthermore, the light transmissive member can contain a wavelength conversion material.

The method of manufacturing a light emitting device related to another embodiment can further include turning the light emitting element extracted from the second recess so that the first element lateral face faces up, subsequent to the extracting of the light emitting element from the second recess, but before the covering with the light transmissive member. This can position the light emitting element extracted from the second recess to be readily covered with the light transmissive member, thereby allowing the light transmissive member formation to be performed with precision.

According to the method of manufacturing a light emitting device related to another embodiment, moreover, the light emitting element can be placed so that the substrate face of the light emitting element faces the second recess bottom face of the second recess in the placing of the light emitting element in the second recess.

According to the method of manufacturing a light emitting device related to another embodiment, in the covering of the light emitting element with the first cover member, the light emitting element can be placed so that the first cover member comes into contact with the first recess first inner lateral face of the first recess.

According to the method of manufacturing a light emitting device related to another embodiment, in the covering with the second cover member, the second cover member can be disposed so as to be in contact with the second recess first inner lateral face of the second recess.

According to the method of manufacturing a light emitting device related to another embodiment, furthermore, the first cover member and the second cover member can contain a reflecting material.

According to the method of manufacturing a light emitting device related to another embodiment, the first mold can have a first through hole in the first recess bottom face facing the substrate face of the light emitting element.

According to the method of manufacturing a light emitting device related to another embodiment, moreover, subsequent to the placing of the light emitting element in the first recess, but before the covering with the first cover member, a third mold for closing the first recess can be placed in contact with the electrodes while the light emitting element is positioned in the first recess.

According to the method of manufacturing a light emitting device related to another embodiment, furthermore, subsequent to the disposing of the light emitting element in the second recess, but before the covering with the second cover member, the third mold for closing the second recess can be placed in contact with the electrodes while the light emitting element is positioned in the second recess.

According to the method of manufacturing a light emitting device related to another embodiment, moreover, the third mold can be formed into a plate shape.

According to the method of manufacturing a light emitting device related to another embodiment, the third mold can have a third recess formed in an area that faces the first recess.

First Embodiment

Figure 2:
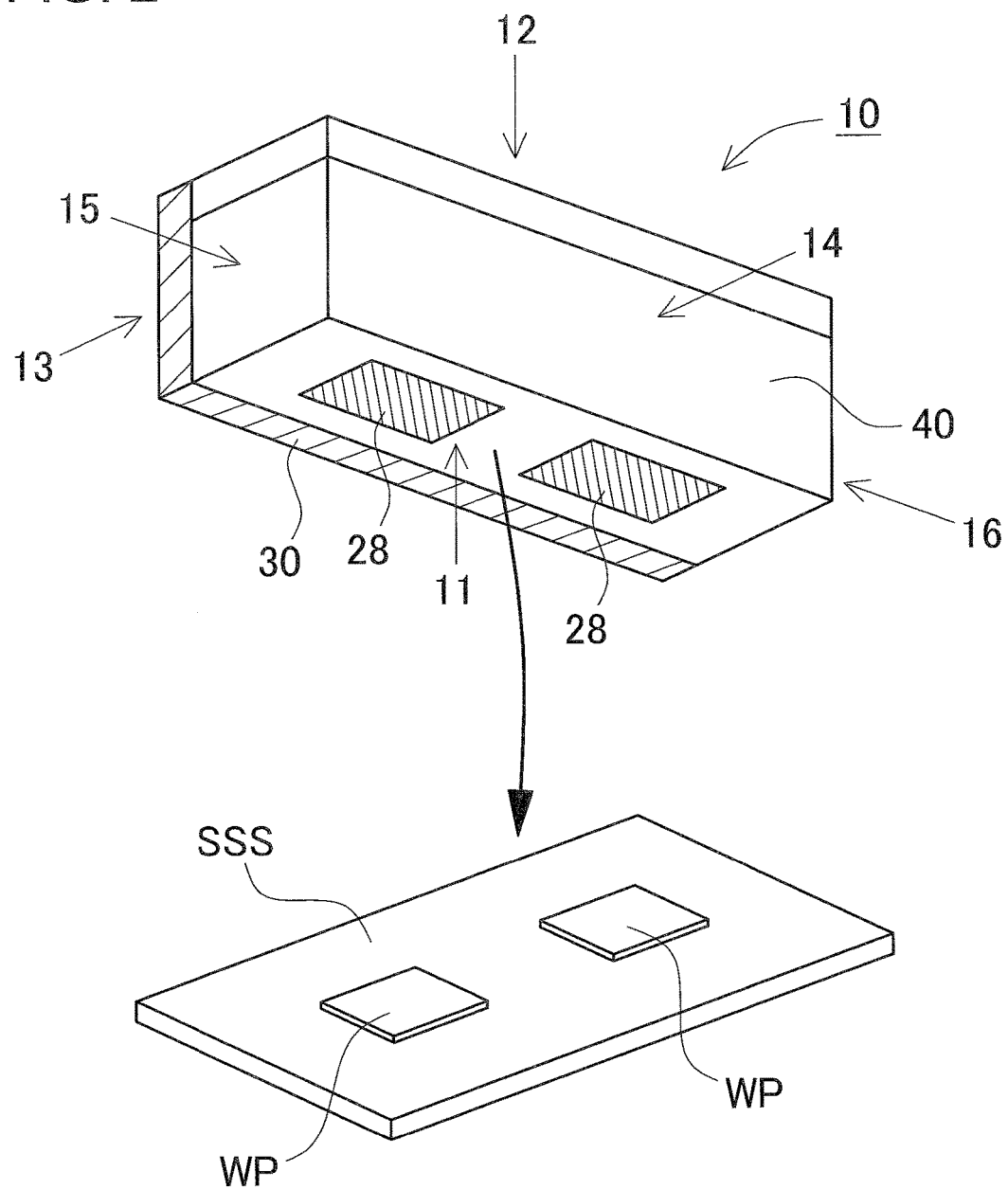
FIG. 2 is a schematic exploded perspective view of the light emitting device in FIG. 1 to be mounted on a secondary substrate.
Figure 3:
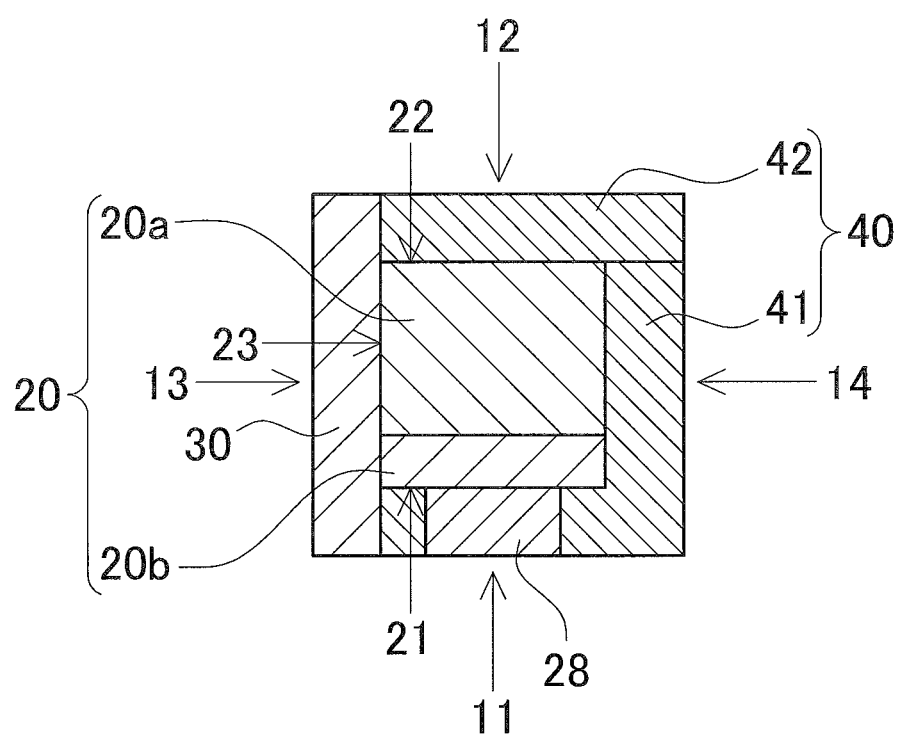
FIG. 3 is a schematic cross sectional view of the light emitting device taken along line III-III in FIG. 1.

A light emitting device 10 according to a First Embodiment of the present invention is shown in FIG. 1 to FIG. 3. FIG. 1 is a perspective view of the light emitting device according to the First Embodiment. FIG. 2 is an exploded perspective view of the light emitting device in FIG. 1 to be mounted on a secondary substrate SSS. FIG. 3 is a cross sectional view taken along line III-III in FIG. 1. FIG. 1 is a perspective view on the upper face side. FIG. 2 is a perspective view on the lower face side.

The light emitting device 10 is of a lateral emission type, i.e., side-view type. The light emitting device 10 is substantially a rectangular parallelepiped shape which has a front face 13 serving as the emission face of the light emitting device 10, a back face 14 on the opposite side thereof, an upper face 12, a lower face 11 opposing the upper face 12, a right lateral face 15 and a left lateral face 16 relative to the front face 13. The light emitting device 10 includes a light emitting element 20, a cover member 40 that covers the light emitting element 20, and a light transmissive member 30 that transmits the light from the light emitting element 20. At the lower face 11 of the light emitting device 10, a pair of electrodes 28 is exposed from the cover member 40. As shown in FIG. 2, the pair of electrodes 28 is electrically connected to the wiring WP on the secondary substrate SSS. The front face (i.e., emission face of the device) 13 provided with the light transmissive member 30 is oriented to face sideways (i.e., direction substantially paralleling the upper face of the secondary substrate SSS) when mounted on the secondary substrate SSS. The faces other than the front face 13 and the lower face 11, i.e., the upper face 12, the back face 14, the right lateral face 15, and the left lateral face 16, are structured by the cover member 40. The cover member 40 functions as a reflecting member for reflecting the light from the light emitting element 20.

In the light emitting device 10 the example shown in FIG. 1, front face 13 and upper face 12 each has a horizontally elongated rectangular shape, and the lateral faces each have a square shape. However, the shape of the light emitting device is not limited to such configuration and can be appropriately selected, for example, it may have square front and upper faces and rectangular lateral faces.

As shown in FIG. 3, the light transmissive member 30 and the first element lateral face 23 of the light emitting element 20 are in contact with one another. The light transmissive member 30 and the first element lateral face 23 (i.e., emission face of the element) overlap each other in a front view in this manner, thereby increasing the light extraction efficiency of the light emitting device.

Light Emitting Element

Figure 8:
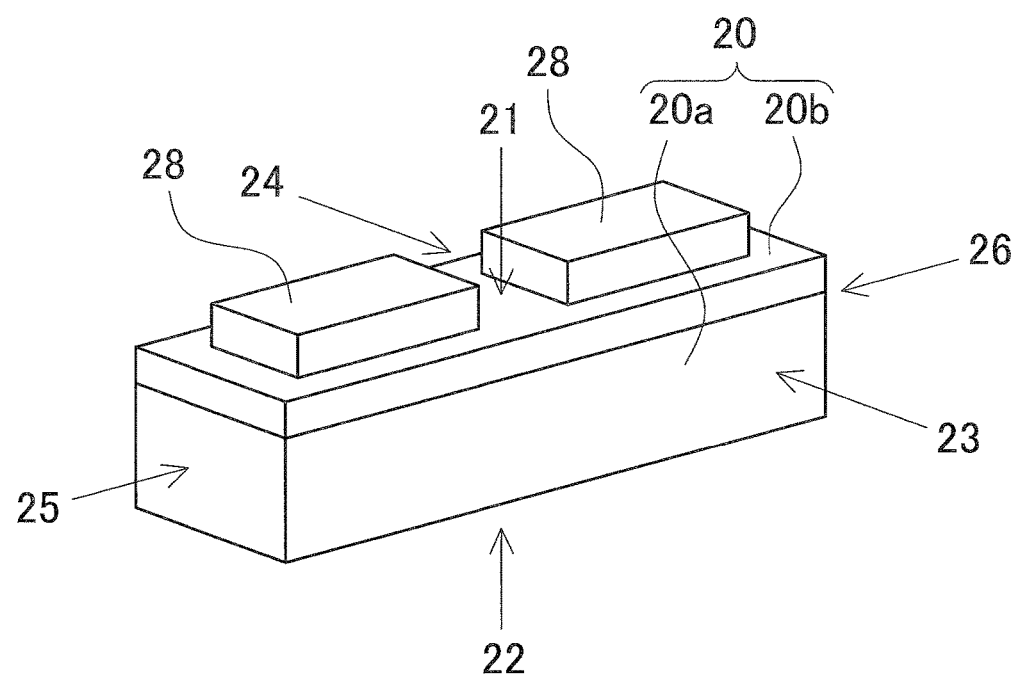
FIG. 8 is a perspective view of the light emitting element shown in FIG. 4A1 and FIG. 4A2.

For the light emitting element, a semiconductor light emitting element such as a light emitting diode or the like can be used. A light emitting element capable of emitting blue, green, red visible light, or the like can be used. As shown in FIG. 8, the semiconductor light emitting element can include a light transmissive substrate 20a and a semiconductor stack 20b formed thereon. The semiconductor stack 20b includes an electrode formation face 21 on which electrodes 28 are formed on the opposite side of (the face opposing) the light transmissive substrate.

Semiconductor Stack 20b

The semiconductor stack 20b includes a plurality of semiconductor layers. As an example, the semiconductor stack 20b can include three semiconductor layers: a first conductivity type semiconductor layer (e.g., n-type semiconductor layer), an emission layer (i.e., active layer), and a second conductivity type layer (e.g., p-type semiconductor layer). Semiconductor layers capable of emitting ultraviolet light or blue to green visible light can be formed, for example, from semiconductor materials, such as group III-V compound semiconductors and group II-VI compound semiconductors. Specifically, nitride-based semiconductor materials, such as $In_XAl_YGa_{1-X-Y}N$ ($0 \le X$, $0 \le Y$, $X+Y \le 1$), for example, InN, AlN, GaN, InGaN, AlGaN, InGaAlN, and the like, can be used. For a semiconductor stack 20b capable of emitting red light, GaAs, GaAlAs, GaP, InGaAs, InGaAsP, and the like can be used.

Light Transmissive Substrate 20a

For the light transmissive substrate 20a of the light emitting element, in the case of the nitride-based semiconductors described above, for example, a light transmissive insulating material such as sapphire ($Al_2O_3$) or a semiconductor material that transmits the emitted light from the semiconductor stack 20b (e.g., a nitride-based semiconductor material) can be used. Examples include GaAlAs, InGaAs, and the like in the case of a semiconductor material such as GaAs. The transmissivity here refers to the property of being able to transmit at least about 60%, 65%, 70%, or 80% of the emitted light from the light emitting element.

Electrode 28

The pair of electrodes 28 of the light emitting element is disposed on the same side of the semiconductor layers. The electrodes 28 may configure a single layer or multilayer structure as long as they can establish an ohmic contact respectively with the first conductivity type semiconductor layer and the second conductivity type semiconductor layer so as to have linear or substantially linear current-voltage characteristics. Such electrodes 28 can be formed by employing materials and structures known in the art having a given thickness, preferably for example, 10 μm to 300 μm. For the electrodes 28, moreover, a good electrical conductor, preferably a metal, such as Cu, Au, Ag, AuSn, or the like, can be used.

Light Transmissive Member 30

For the light transmissive member 30, light transmissive resins, glass, and the like can be used. Particularly, the light transmissive member 30 is configured with light transmissive resin, such as thermosetting resins including silicone resins, silicone modified resins, epoxy resins, or phenol resins; thermoplastic resins including polycarbonate resins, acrylic resins, methylpentene resins, or polynorbornene resins. Specifically, highly light resistant and highly heat resistant silicone resins are preferable.

The light transmissive member 30 can include a wavelength conversion material in addition to the light transmissive materials described above. For the light transmissive member 30, a phosphor can be suitably utilized. A phosphor excitable by the light from the light emitting element is used. Examples of phosphors excitable by light emitted from a blue light emitting element or ultraviolet light emitting element include cerium-activated yttrium aluminum garnet-based phosphors (YAG:Ce); cerium-activated lutetium aluminum garnet-based phosphors (LAG:Ce); europium- and/ or chromium-activated nitrogen-containing calcium aluminosilicate-based phosphors ($CaO$—$Al_2O_3$—$SiO_2$); europium-activated silicate-based phosphors (($Sr,Ba$)$_2SiO_4$); nitride-based phosphors, such as β-SiAlON phosphors, CASN-based phosphors, SCASN-based phosphors; KSF-based phosphors ($K_2SiF_6$:Mn); sulfide-base phosphors, and quantum dot phosphors. By combining these phosphors with a blue or ultraviolet light emitting element, light emitting devices of various emission colors (e.g., a white light emitting device) can be produced. The first light transmissive member can contain various fillers for the purpose of viscosity adjustment and the like.

Cover Member

The cover member includes a first cover member 41 and a second cover member 42. Resin materials that can be preferably used for the cover member are thermosetting light transmissive resins, in particular, silicone resins, silicone modified resins, epoxy resins, and phenol resins.

The cover member can be configured by a light reflecting resin containing a reflecting material. Light reflecting resins refer to resin materials that reflect at least 70% of the light from the light emitting element. Reflecting the light reaching the cover member towards the emission face of the light emitting device can increase the light extraction efficiency of the light emitting device.

For the light reflecting resin, for example, a light transmissive member containing a light reflecting substance dispersed therein can be used. Preferable light reflecting substances include titanium oxide, silicon oxide, zirconium oxide, potassium titanate, aluminum oxide, aluminum nitride, boron nitride, and mullite. A light reflecting substance in a granular, fibrous, or thin flake form can be used, but the fibrous form is particularly preferable as it is expected to also have the effect of reducing the thermal expansion coefficient of the cover member.

Method of Manufacturing Light Emitting Device According to First Embodiment

A method of manufacturing a light emitting device according to the First Embodiment will be explained next based on FIG. 4A1 to FIG. 5D2. FIG. 4A1, FIG. 4B1, and FIG. 4C1 are schematic end views when the light emitting device is viewed from the right lateral face side, FIG. 4A2, FIG. 4B2, FIG. 4C2, and FIG. 4D2 are schematic end views when the light emitting device is viewed from the front face side. In these drawings, the light emitting element 20 has square right and left lateral faces and rectangular front and back faces as an example. However, the light emitting device according to the present disclosure can have other structures, and may have, for instance, rectangular right and left lateral faces and square front and back faces.

Providing Light Emitting Elements 20 and Molds

First, light emitting elements 20 and molds are separately provided. For the light emitting elements 20, for example, semiconductor light emitting elements, such as light emitting diodes, are provided. The light emitting elements 20 each include a growth substrate, a semiconductor stack, and a pair of positive and negative electrodes. As shown in the perspective view in FIG. 8, the light emitting element includes an electrode formation face 21 where the electrodes are formed, and a substrate face 22 on the opposite side of the electrode formation face. The light emitting element 20 further includes a first element lateral face 23 and a second element lateral face 24 on the opposite side of the first element lateral face 23 which are located between the electrode formation face 21 and the substrate face 22. The light emitting element further includes a third element lateral face 25 and a fourth element lateral face 26 on the opposite side of the third element lateral face 25 which are located between the electrode formation face 21 and the substrate face 22.

Figure 4:
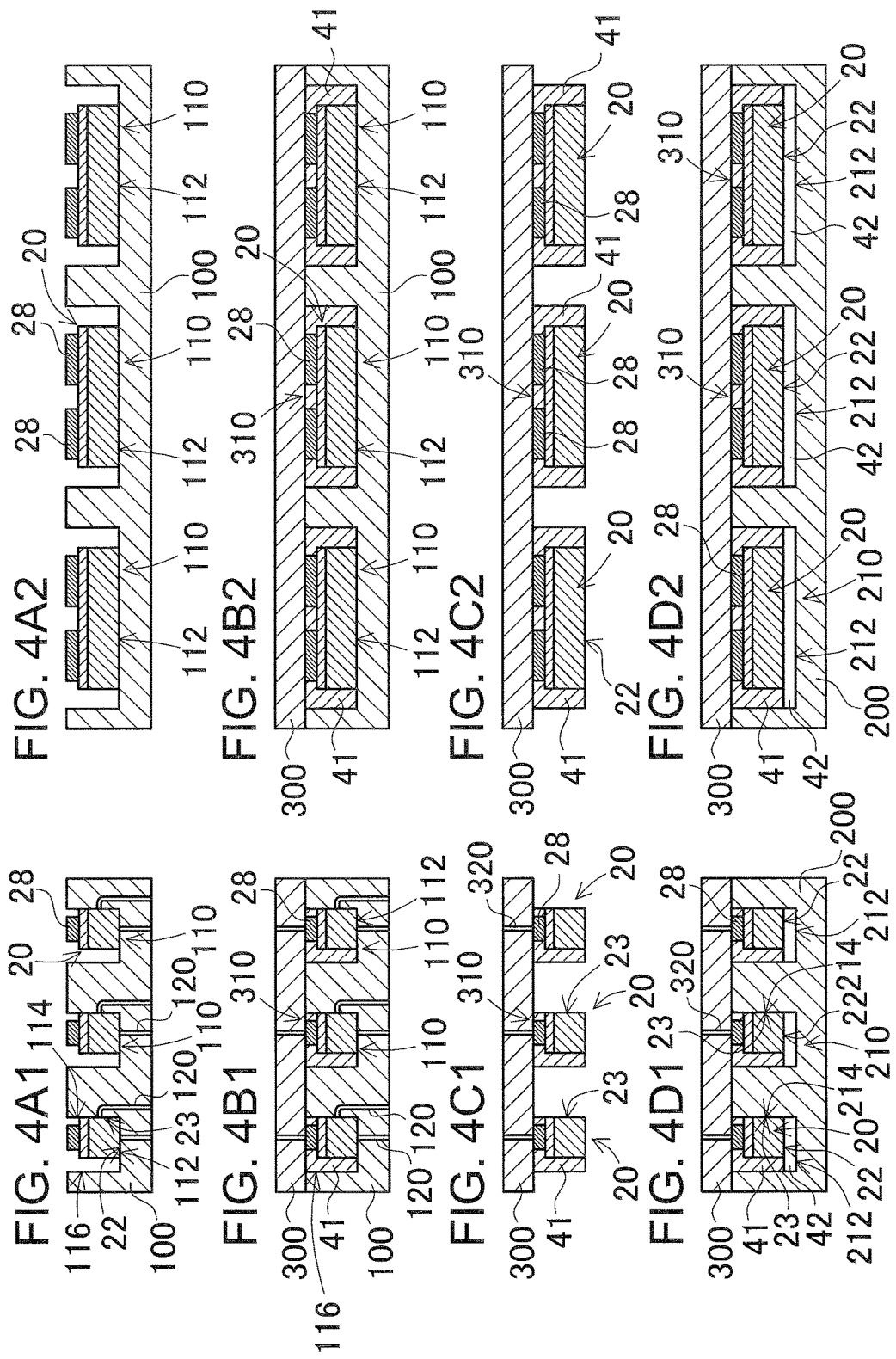

For the molds, a first mold 100, a second mold 200, and a third mold 300 are separately provided. As shown in FIG. 4A1, FIG. 4A2, etc., the first mold 100 has a plurality of first recesses 110 which are open at the top. The first recesses 110 each have a first recess bottom face 112 and a first recess first inner lateral face 114 which is in contact with the first recess bottom face 112.

Each first recess 110 is sized to be able to house at least one piece of a light emitting element 20. Each first recess 110 includes a bottom face (i.e., first recess bottom face 112) and four lateral faces. The four lateral faces consist of two long lateral faces and two short lateral faces where the long lateral faces oppose to each other and the short lateral faces oppose to each other. In the example shown in FIG. 4A1 and FIG. 4A2, the first recess bottom face 112 of each first recess 110 is rectangular in shape, yet the present invention is not limited to such configuration, for example, the bottom face can have other shape, may be a square.

One of the long lateral faces of a first recess 110 of the first mold (i.e., lower mold) 100 is the first recess first inner lateral face 114. The other inner lateral face of each first recess 110 is referred to as the first recess second inner lateral face 116. The first recess first inner lateral face 114 is in contact with the first element lateral face 23 of a light emitting element 20 after the light emitting element 20 is housed in the first recess 110. The long lateral face (a first recess second inner lateral face 116) facing the first recess first inner lateral face 114 of the long lateral faces of each first recess creates a space while facing and being spaced apart from the second element lateral face 24 of each light emitting element 20. The short lateral faces of each first recess 110 of the first (i.e., lower mold) mold 100 face the third element lateral face 25 and the fourth element lateral face 26 of a light emitting element 20 after the light emitting element 20 is housed in the first recess 110.

As shown in FIG. 4D1, FIG. 4D2 etc., the second mold 200 has a plurality of second recesses 210 which are open at the top. The second recesses 210 each have a second recess bottom face 212 and a second recess first inner lateral face 214 which is in contact with the second recess bottom face 212.

As shown in FIG. 4B1, FIG. 4B2, etc., the third mold 300 is formed into a plate shape so as to close the openings of the first recesses 110. For the first mold, the second mold, and the third mold, a known material such as steel can be used. The third mold 300 has third recesses 310 formed in the regions facing the first recesses 110 of the first mold 100.

Placing Light Emitting Elements 20 in First Recesses 110

Subsequently, the light emitting elements 20 are placed in the first recesses 110. Here, as shown in FIG. 4A1 and FIG. 4A2, the first element lateral faces 23 of the light emitting elements 20 are in contact with the first recess first inner lateral faces 114 of the first recesses 110 of the first mold 100. The light emitting elements 20 are placed in the first recesses 110 while maintaining the position that the substrate faces 22 of the light emitting elements 20 face the first recess bottom faces 112 of the first recesses 110. At this time, the first recesses 110 of the first mold 100 are designed so that the upper faces of the electrodes 28 are of substantially the same height as the opening edges of the first recesses 110.

The light emitting elements 20 are placed so that their second element lateral faces 24 to the fourth element lateral faces 26 create spaces by being spaced apart from the first recess inner lateral faces of the first recesses 110 in the first mold 100. In other words, the second element lateral face 24 through the fourth lateral face 26 of the light emitting element 20 are positioned in such a manner as to create spaces by respectively being spaced apart from the first recess second inner lateral faces 116 of the first recess 110. The shape and size of the recesses 110 are designed so that the thickness of the respective spaces equals the thickness of the first cover members 41.

Covering with First Cover Member 41

Subsequently, the second element lateral face 24 to the fourth element lateral face 26 of each light emitting element 20 exposed from the first recess second inner lateral face 116 in the first recess 110 are covered with a first cover member 41. Here, as shown in FIG. 4B1 and FIG. 4B2, each first cover member is formed by filling with a resin the spaces between the second element lateral face 24 to the fourth element lateral face 26 of the light emitting element 20 and the first recess second inner lateral face 116 of the first recess 110 while the first recess 110 of the first mold 100 is being closed by the third mold 300. At this time, it is preferable to not form the first cover member on the electrodes by not creating gaps between the first element lateral face 23 of the light emitting element 20 and the first recess first inner lateral face 114 of the first mold 100, and between the upper faces of the electrodes and the third mold 300. At this time, the light emitting elements 20 placed in the first recesses 110 are maintained without being displaced. In the example shown in FIG. 4B1 and FIG. 4B2, first through holes 120 are created in the first mold 100, and the light emitting elements 20 are held by suctioning through the first through holes 120. The first through holes 120 are created at the first recess bottom faces 112 which face the substrate faces 22 of the light emitting elements 20. The first through holes 120 may be created at multiple faces, and in the example shown in FIG. 4B1 and FIG. 4B2, for example, they are also created in the first recess first inner lateral faces 114 of the first recesses 110 that are in contact with the first element lateral faces 23 of the light emitting elements 20. By suctioning through the first through holes 120 in this way, the light emitting elements 20 can be more stably held. In the case of forming a first cover member on the electrodes of the light emitting element, the first cover member is removed to expose the electrodes therefrom. The step of removing the first cover member can be performed by known methods, such as grinding, blasting, or the like.

Extracting Light Emitting Elements 20 from First Recesses 110

Once the resin injected into the first recesses 110 hardens whereby the first cover member has been formed, the light emitting elements 20 covered with the first cover member are extracted from the first recesses 110. In the example shown in FIG. 4C1 and FIG. 4C2, the third mold 300 is utilized to release the light emitting elements 20 as being fixed to the third mold 300. For example, the suction applied through the first through holes 120 of the first mold 100 is released, while fixing the light emitting elements 20 to the third mold 300 by suctioning through the third through holes 320 created therein. Alternatively, before closing the first recesses 110 of the first mold 100 with the third mold 300, an adhesive may be applied to the areas of contact with the electrodes 28.

Placing Light Emitting Elements 20 in Second Recesses 210

Subsequently, the light emitting elements 20 are placed in the second recesses 210. Here, as shown in FIG. 4D1 and FIG. 4D2, the light emitting elements 20 are placed in the second recesses 210 by bringing the first element lateral faces 23 of the light emitting elements 20 into contact with the second recess first inner lateral faces 214 of the second recesses 210 of the second mold 200, and allowing the substrate faces 22 of the light emitting elements 20 to be spaced apart from the second recess bottom faces 212 of the second recesses 210. The second recesses 210 are designed to the size and shape to be able to house the light emitting elements 20 having the first cover members formed thereon and form spaces between the substrate surfaces 22 and the second recess bottom faces 212. The depth of the second recesses 210 is adjusted so that the gap between the substrate faces 22 and the second recess bottom faces 212 becomes the thickness of the second cover members 42. In the example shown in FIG. 4D1 and FIG. 4D2, the second recesses 210 are formed at the positions corresponding to the light emitting elements 20 so that the second recesses 210 of the second mold 200 can be closed with the third mold 300 to which the light emitting elements 20 are fixed.

Covering with a Second Cover Member 42

Figure 5:
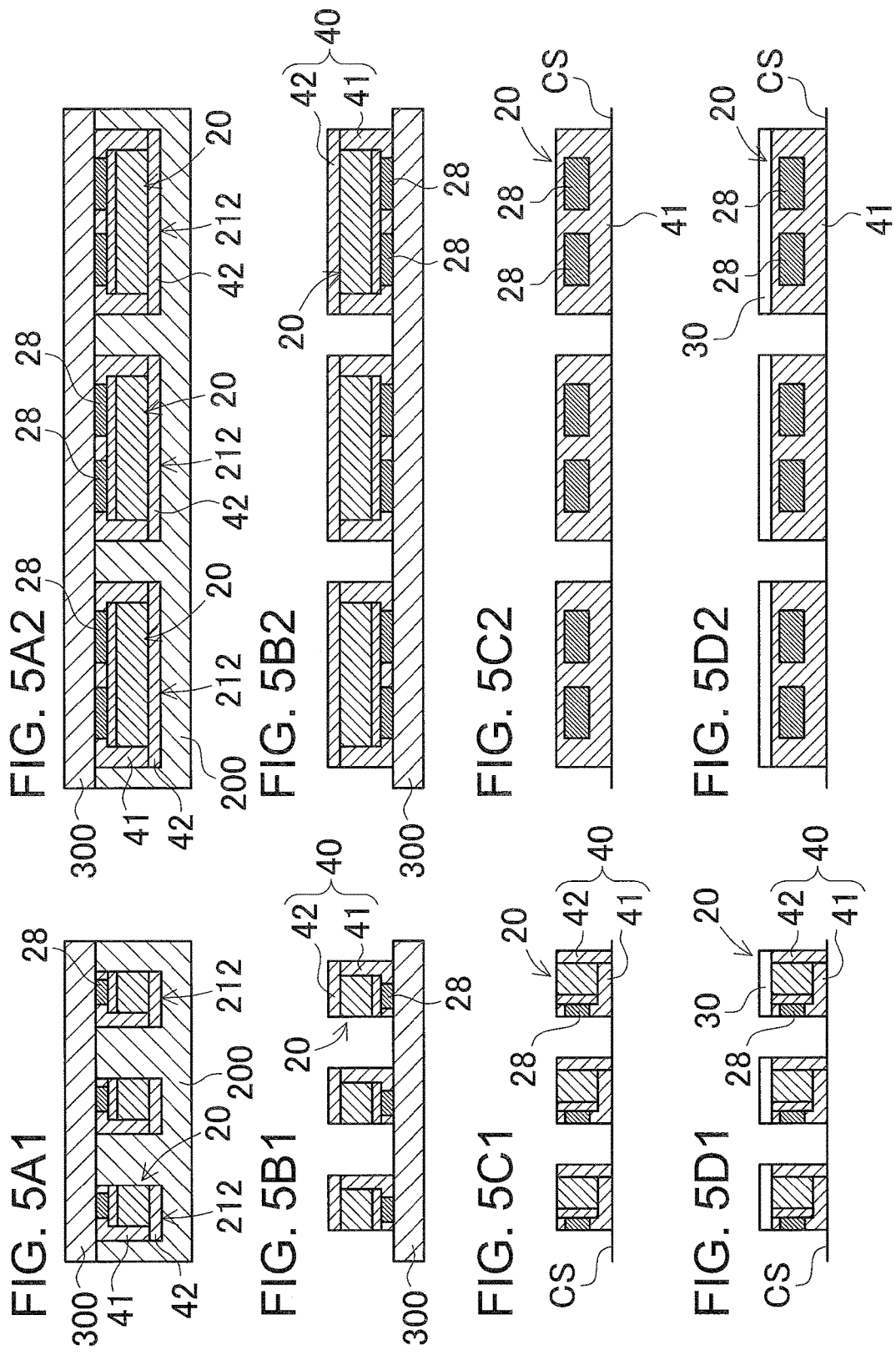

Subsequently, the substrate faces 22 of the light emitting elements 20 are covered with a second cover member 42 in the second recesses 210. Here, as shown in FIG. 5A1 and FIG. 5A2, the second cover member is formed by filling with a resin the spaces between the second recess bottom faces 212 of the second recesses 210 and the substrate faces 22 of the light emitting elements 20 in the state where the second recesses 210 of the second mold 200 are closed with the third mold 300. It is also preferable here to not create any gaps between the first element lateral faces 23 of the light emitting elements 20 and the second recess first inner lateral faces 214 of the second mold 200, and between the electrode formation faces 21 and the third mold 300 so as not to form the second cover member in these regions. At this time, the light emitting elements 20 placed in the second recesses 210 are held so as not to be displaced. Here, because the light emitting elements 20 are fixed to the third mold 300 beforehand, it is unnecessary to provide the second mold 200 with a structure for suctioning.

Extracting Light Emitting Elements 20 from Second Recesses 210

Once the resin injected into the second recesses 210 hardens whereby the second cover members have been formed, the light emitting elements 20 covered with the first cover members and the second cover members are released from the second recesses 210. For example, the light emitting elements 20 fixed to the third mold 300 can be released from the second recesses 210 by separating the third mold 300 from the second mold 200. The example in FIG. 5B1 and FIG. 5B2 is shown in the state where the position of the third mold 300 released form the second mold 200 is inverted. Alternatively, a carrier sheet may be used. For example, by interposing a carrier sheet and adhering the light emitting elements 20 to the carrier sheet when closing the first mold 100 with the third mold 300, the light emitting elements 20 together with the carrier sheet can be released from the first mold 100 and the second mold 200. Alternatively, the light emitting elements 20 retained in the second recesses 210 when the third mold 300 is separated from the state shown in FIG. 5B1 and FIG. 5B2 can be adhered to a carrier sheet via an adhesive or the like to be extracted from the second recesses 210.

Turning Light Emitting Elements 20

The light emitting elements 20 are turned so that the first element lateral faces 23 (i.e., element emission faces) face up in order to facilitate the formation of light transmissive members 30 on the element emission faces. In the example shown in FIG. 5C1 and FIG. 5C2, the light emitting elements 20 are placed on a carrier sheet CS.

Light Transmissive Member 30 Coating

In this state, light transmissive members 30 are formed on the first element lateral faces 23 (i.e., element emission faces) of the light emitting elements 20 as shown in FIG. 5D1 and FIG. 5D2. The light transmissive members 30 are formed to continuously cover the first element lateral faces 23 of the light emitting elements 20, the first cover members 41, and the second cover members 42. The light transmissive members can be formed by known methods, such as potting, spraying, printing, and the like.

As described above, downsized light emitting devices in which light emitting elements 20 are covered with cover members can be efficiently produced by using molds.

Method of Manufacturing Light Emitting Devices According to Second Embodiment

Figure 6:
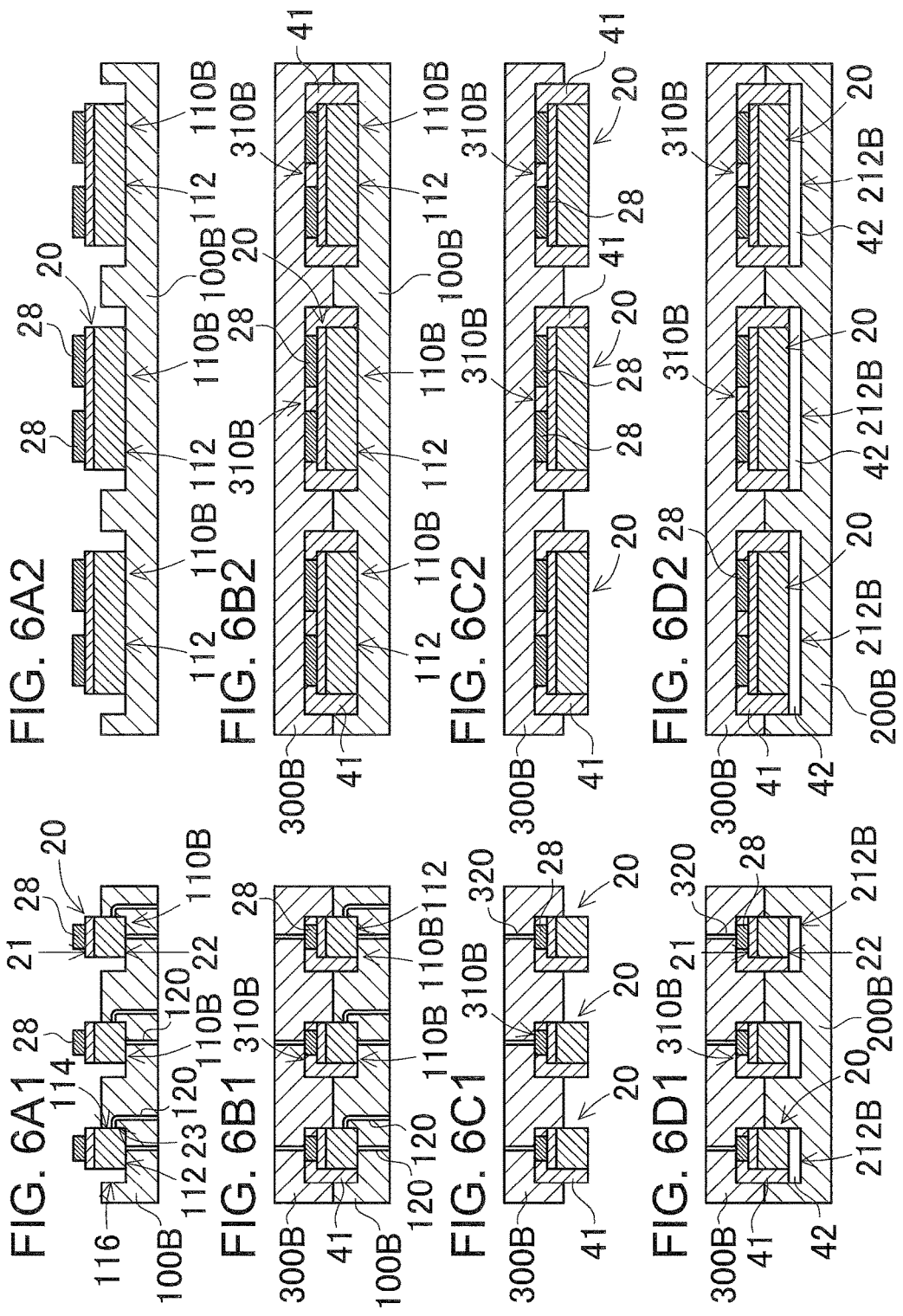

In the examples explained in the foregoing, a sheet form mold was used as the third mold, but the light emitting device according to the present disclosure is not limited to such configuration and it can have other structure. As such, the third mold may also have recesses. FIG. 6A1 to FIG. 7D2 show such an example as a Second Embodiment. The third mold 300B has third recesses 310B in the areas facing the first recesses 110B of the first mold 100B. The first mold 100B and the second mold 200B respectively have first recesses 110B and second recesses 210B which are designed to have smaller depths than those of the first recesses in the First Embodiment so that they allow for the first cover members and second cover members to be formed on the light emitting elements 20, when combined with the third recesses 310B. The method of manufacturing a light emitting device in the Second Embodiment employing the first mold 100B, the second mold 200B, and the third mold 300B is substantially the same as the First Embodiment. That is, light emitting elements 20 and molds are separately provided, followed by placing the light emitting elements 20 in the first recesses 110B as shown in FIG. 6A1 and FIG. 6A2. Here, the electrodes 28 are higher than, but not coplanar with, the upper face of the first mold 100B. Subsequently, as shown in FIG. 6B1 and FIG. 6B2, the third mold 300B is aligned so as to close the first recesses 110B with the third recesses 310B, and the second element lateral faces 24 to the fourth element lateral faces 26 of the light emitting elements 20 are covered with first cover members 41 in the first recesses 110B and the third recesses 310B. Once the resin hardens whereby the first cover members have been formed, the light emitting elements 20 covered with the first cover members are extracted from the first recesses 110B as shown in FIG. 6C1 and FIG. 6C2. Here, because the light emitting elements 20 covered with the first cover members are securely held in the third recesses 310B of the third mold 300B, the third mold 300B can be released while stably holding the light emitting elements 20, comparatively.

Figure 7:
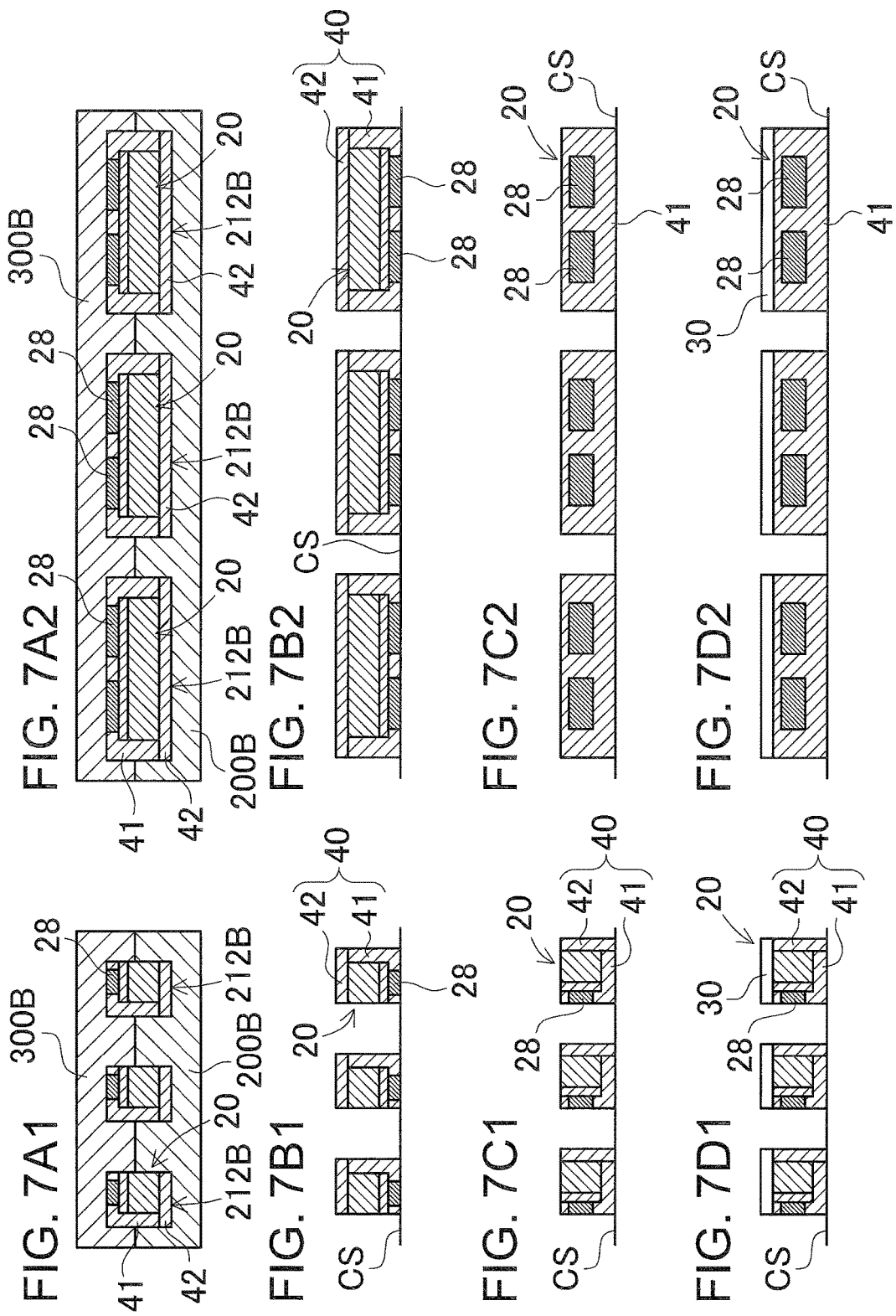

Then, as shown in FIG. 6D1 and FIG. 6D2, the second mold 200B and the third mold 300B are combined, placing the light emitting elements 20 in the spaces created by the second recesses 210B and the third recesses 310B. By filling the gaps between the substrate faces 22 and the second recess bottom faces 212B with a second cover member 42 in this state, the light emitting elements 20 are covered with the second cover member 42 as shown in FIG. 7A1 and FIG. 7A2. The light emitting elements 20 are then extracted from the second recesses 210B and the third recesses 310B as shown in FIG. 7B1 and FIG. 7B2. The light emitting elements 20 are placed on a carrier sheet CS so that the element emission faces face up as shown in FIG. 7C1 and FIG. 7C2, and the light transmissive members 30 are formed on the first element lateral faces 23 (i.e., element emission faces) as shown in FIG. 7D1 and FIG. 7D2. The method described above can also efficiently manufacture downsized light emitting devices in which light emitting elements 20 are covered with cover members using molds.

The methods of manufacturing light emitting devices according to the embodiments of the present disclosure can be suitably utilized for backlight light sources for LED display devices and liquid crystal display devices, and the like, light sources for lighting fixtures, headlights, traffic lights, illuminated switches, various sensors and indicators, and light sources for other general consumer products.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. A method of manufacturing a light emitting device comprising:
    providing a light emitting element, a first mold, and a second mold,
        the light emitting element including
            an electrode formation face where electrodes are formed,
            a substrate face located on a side of the light emitting element opposite to the electrode formation face, and
            a first element lateral face,
            a second element lateral face,
            a third element lateral face, and
            a fourth element lateral face, the first, second, third, and fourth lateral faces being positioned between the electrode formation face and the substrate face,
        the first mold including a first recess having a first recess bottom face and a first recess first inner lateral face being in contact with the first recess bottom face, and
        the second mold including a second recess having a second recess bottom face and a second recess first inner lateral face being in contact with the second recess bottom face;
    placing the light emitting element by bringing the first element lateral face of the light emitting element into contact with a first recess first inner lateral face of the first recess of the first mold, and allowing the substrate face of the light emitting element to face the first recess bottom face of the first recess;
    covering, with a first cover member, the second element lateral face, the third element lateral face, and the fourth element lateral face of the light emitting element exposed in the first recess;
    extracting from the first recess the light emitting element equipped with the first cover member formed thereon;
    placing the light emitting element in the second recess by bringing the first element lateral face of the light emitting element extracted from the first recess into contact with the second recess first inner lateral face of the second recess of the second mold, and allowing the substrate face of the light emitting element to be spaced apart from the second recess bottom face of the second recess;

covering, with a second cover member, the substrate face of the light emitting element in the second recess; and extracting from the second recess the light emitting element equipped with the second cover member formed thereon.

2. The method of manufacturing a light emitting device according to claim 1, further comprising covering, with a light transmissive member, the first element lateral face of the light emitting element equipped with the second cover member formed thereon, subsequent to extracting the light emitting element from the second recess.

3. The method of manufacturing a light emitting device according to claim 2, wherein the first element lateral face of the light emitting element, the first cover member, and the second cover member are continuously covered with the light transmissive member.

4. The method of manufacturing a light emitting device according to claim 2, wherein the light transmissive member contains a wavelength conversion material.

5. The method of manufacturing a light emitting device according to claim 2, further comprising turning the light emitting element extracted from the second recess so that the first element lateral face faces up, subsequent to the extracting of the light emitting element from the second recess, but before the covering with the light transmissive member.

6. The method of manufacturing a light emitting device according to claim 1, wherein the light emitting element is placed in the second recess so that the substrate face thereof faces the second recess bottom face of the second recess.

7. The method of manufacturing a light emitting device according to claim 1, wherein, in the covering with the first cover member, the light emitting element is located so that the first cover member is in contact with the first recess first inner lateral face of the first recess.

8. The method of manufacturing a light emitting device according to claim 1, wherein, in the covering with the second cover member, the second cover member is formed in contact with the second recess first inner lateral face of the second recess.

9. The method of manufacturing a light emitting device according to claim 1, wherein the first cover member and the second cover member contain a reflecting material.

10. The method of manufacturing a light emitting device according to claim 1, wherein the first mold has a first through hole created in the first recess bottom face which opposes the substrate face of the light emitting element.

11. The method of manufacturing a light emitting device according to claim 1, further comprising placing a third mold for closing the first recess so as to be in contact with the electrodes while the light emitting element is positioned in the first recess, subsequent to the placing of the light emitting element in the first recess, but before the covering with the first cover member.

12. The method of manufacturing a light emitting device according to claim 11, further comprising placing the third mold to close the second recess so as to be in contact with the electrodes while the light emitting element is positioned in the second recess, subsequent to the placing of the light emitting element in the second recess, but before the covering with the second cover member.

13. The method of manufacturing a light emitting device according to claim 11, wherein the third mold is formed into a plate shape.

14. The method of manufacturing a light emitting device according to claim 11, wherein the third mold is formed to have a third recess in a region facing the first recess.

* * * * *